United States Patent
Lai

(10) Patent No.: US 8,363,401 B2
(45) Date of Patent: Jan. 29, 2013

(54) AIR GUIDING DEVICE AND HEAT DISSIPATION SYSTEM HAVING SAME

(75) Inventor: Yu-Chia Lai, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 189 days.

(21) Appl. No.: 13/047,805

(22) Filed: Mar. 15, 2011

(65) Prior Publication Data

US 2012/0160463 A1    Jun. 28, 2012

(30) Foreign Application Priority Data

Dec. 23, 2010 (TW) ................................ 99145626 A

(51) Int. Cl.
 *H05K 7/20* (2006.01)
 *F28F 13/00* (2006.01)

(52) U.S. Cl. .............. 361/697; 361/679.47; 361/679.48; 361/679.49; 361/679.5; 361/679.51; 361/692; 361/695; 165/80.3; 165/121; 165/122; 165/126

(58) Field of Classification Search ............ 361/679.46–679.55, 690–697, 361/715–724, 727; 165/80.3, 104.33, 121–126, 165/185; 454/184; 174/15.1, 16.1, 16.3, 174/252

See application file for complete search history.

(56) References Cited

U.S. PATENT DOCUMENTS

| | | | | |
|---|---|---|---|---|
| 6,400,568 B1 * | 6/2002 | Kim et al. | ...................... | 361/697 |
| 6,504,718 B2 * | 1/2003 | Wu | .............................. | 361/695 |
| 6,654,244 B2 * | 11/2003 | Laufer et al. | .................. | 361/695 |
| 7,209,352 B2 * | 4/2007 | Chen | ............................. | 361/695 |
| 7,342,786 B2 * | 3/2008 | Malone et al. | ................ | 361/695 |
| 7,391,618 B2 * | 6/2008 | Fujiya et al. | .................. | 361/727 |
| 7,586,746 B2 * | 9/2009 | Liu | ................................. | 361/695 |
| 7,611,401 B1 * | 11/2009 | Koren | ............................ | 451/310 |
| 7,623,346 B2 * | 11/2009 | Fujiya et al. | .................. | 361/694 |
| 8,069,908 B2 * | 12/2011 | Chen et al. | .................... | 165/80.3 |

* cited by examiner

*Primary Examiner* — Michail V Datskovskiy
(74) *Attorney, Agent, or Firm* — Altis Law Group, Inc.

(57) ABSTRACT

An air guiding device is mounted on a main board. The air guiding device and the main board cooperatively form an air passage therebetween for allowing cooling air to pass therethrough. The air passage includes an inlet at a first end of the air guiding device, a first outlet at an opposite second end of the air guiding device, and a second outlet. The air guiding device includes a top wall, two sidewalls, and a shielding assembly. The top wall includes the second outlet therein at an intermediate portion thereof. The second outlet opens toward the second end. The sidewalls extend downwardly from opposite sides of the top wall. The shielding assembly is positioned on the top wall for regulating a size of the second outlet.

10 Claims, 3 Drawing Sheets

AIR GUIDING DEVICE AND HEAT DISSIPATION SYSTEM HAVING SAME

BACKGROUND

1. Technical Field

The present disclosure relates to heat dissipation technologies, and particularly, to an air guiding device and a heat dissipation system having such an air guiding device.

2. Description of Related Art

Electronic devices, such as computers, require dissipation of heat generated by electronic components, such as a central processing unit (CPU), a display card, or an expansion card, such as a video card or a graphics accelerator card, in order to prevent the components from overheating damage. An air guiding device is often used in a computer with a fan to guide airflow to the CPU and the display card therein. However, the expansion card is often positioned outside the air guiding device as the expansion card is too long. Therefore, airflow cannot be introduced to the expansion card and the heat generated by the expansion card cannot be efficiently dissipated.

Therefore, it is desirable to provide an air guiding device and a heat dissipation system having the same, which can overcome or at least alleviate the limitations described.

DETAILED DESCRIPTION

Figure 1:
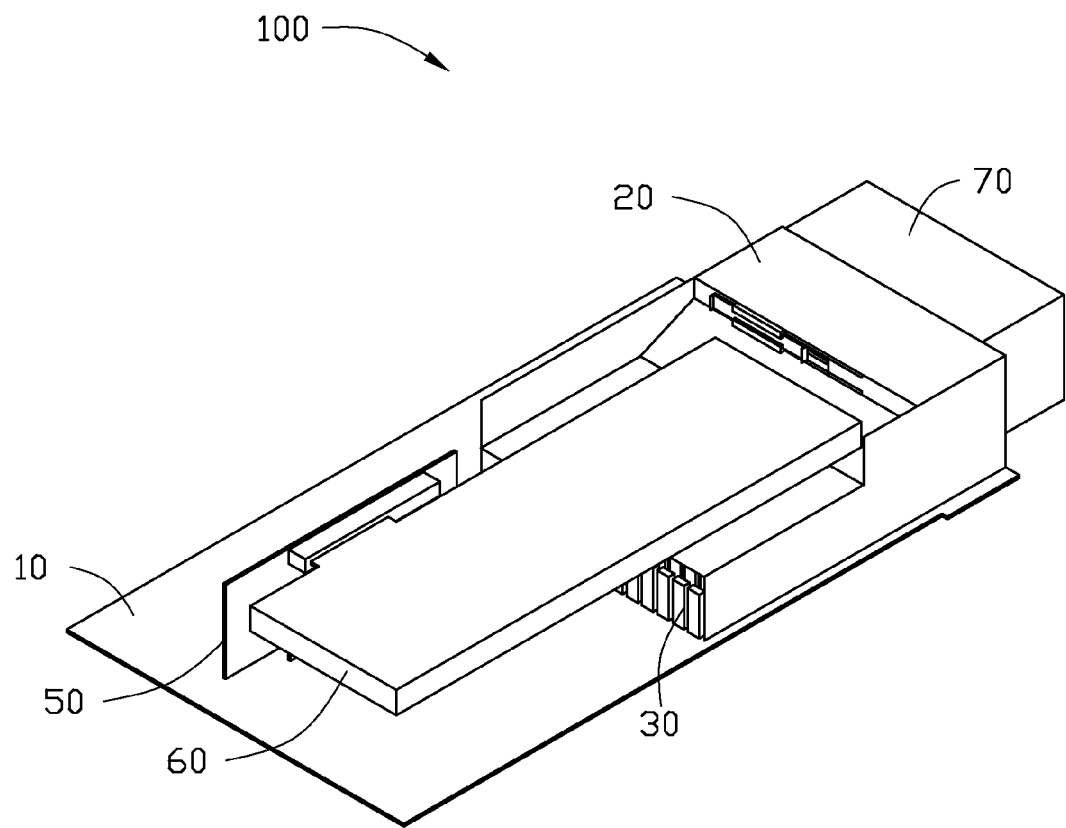
FIG. 1 is a schematic, isometric view of a heat dissipation system including an air guiding device, according to an exemplary embodiment.
Figure 2:
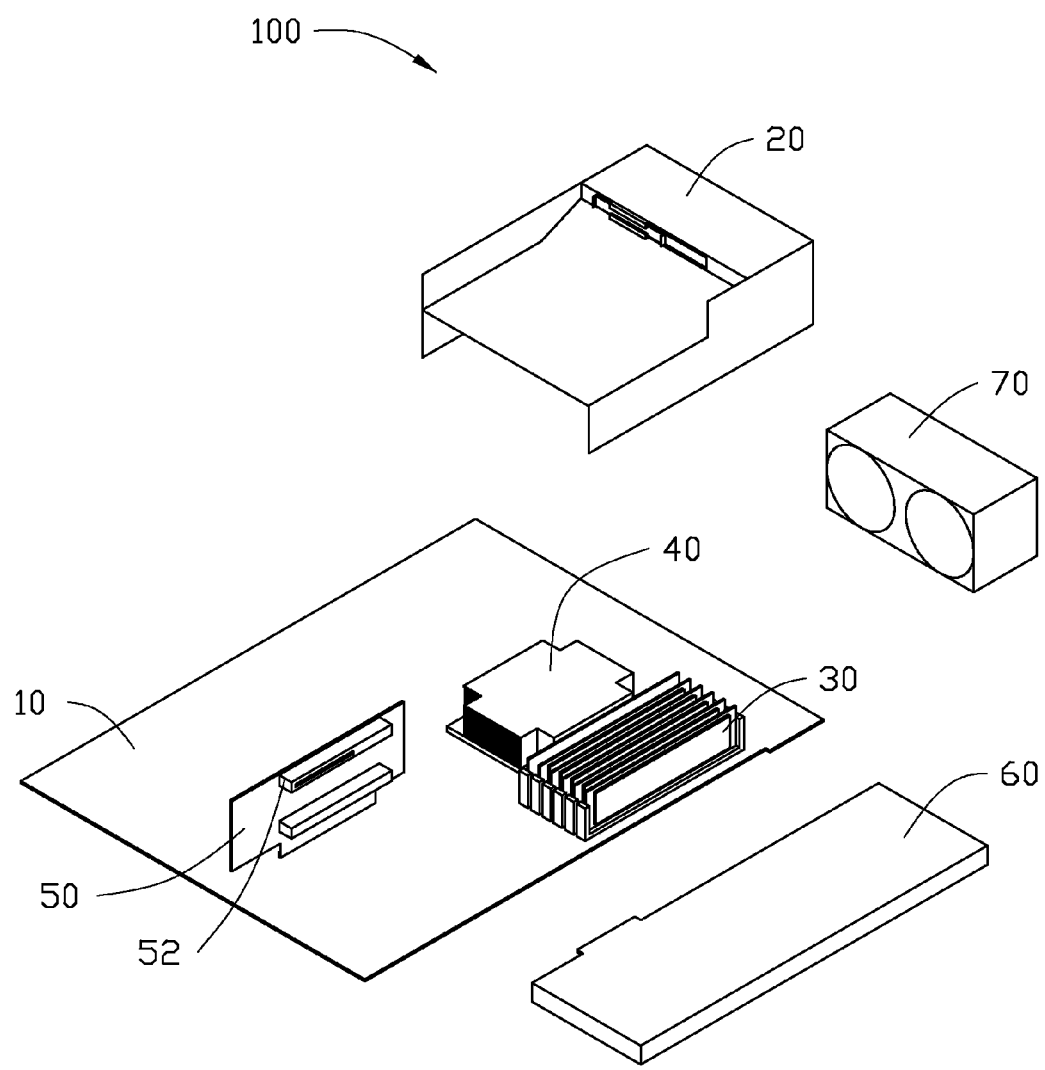
FIG. 2 is an exploded view of the heat dissipation system of FIG. 1.
Figure 3:
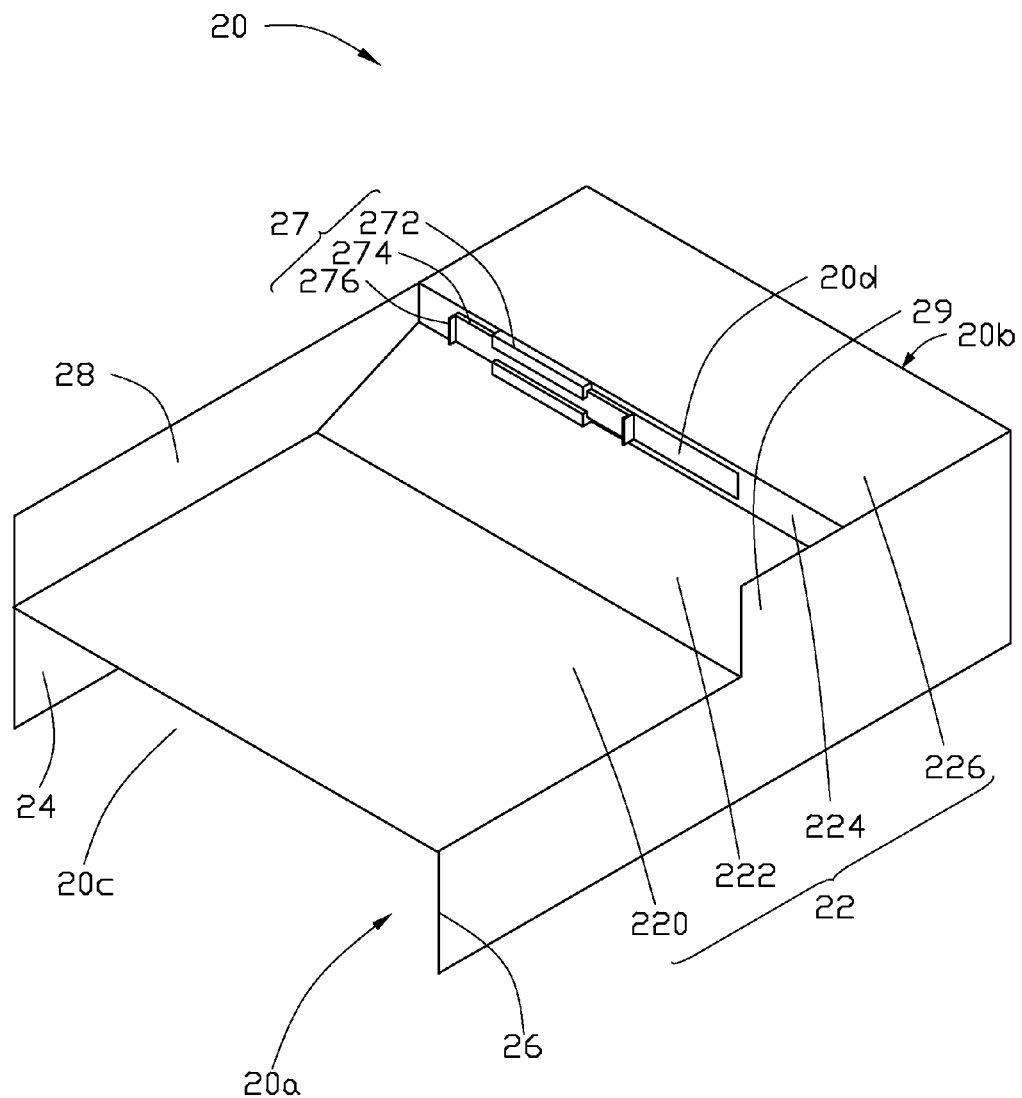
FIG. 3 is a schematic, isometric view of the air guiding device of FIG. 1.

Referring to FIGS. 1-3, a heat dissipation system 100, according to an exemplary embodiment, includes a main board 10, an air guiding device 20, a first heat source 30, a heat sink 40, a socket 50, a second heat source 60, and two fans 70. The air guiding device 20 is mounted on the main board 10, thus the air guiding device 20 and the main board 10 cooperatively forming an air passage 20a therebetween for allowing cooling air to pass therethrough. The first heat source 30, the heat sink 40, the socket 50, the second heat source 60, and the two fans 70 are mounted on the main board 10.

The air passage 20a includes an inlet 20b, a first outlet 20c, and a second outlet 20d. The inlet 20b is positioned at a first end of the air guiding device 20. The first outlet 20c is positioned at an opposite second end of the air guiding device 20.

The air guiding device 20 includes a top wall 22, a first sidewall 24, a second sidewall 26, a shielding assembly 27, a first guide plate 28, and a second guide plate 29.

The top wall 22 includes a first horizontal plate 220, an angled plate 222, a vertical plate 224, and a second horizontal plate 226. The first horizontal plate 220, the angled plate 222, the vertical plate 224, and the second horizontal plate 226 connect to each other in that order.

The first horizontal plate 220 is adjacent to the first outlet 20c and substantially parallel to the main board 10. The angled plate 222 extends from an edge of the first horizontal plate 220. The vertical plate 224 perpendicularly extends from an edge of the angled plate 222. The second horizontal plate 226 perpendicularly extends from an edge of the vertical plate 224. The second horizontal plate 226 is adjacent to the inlet 20b and substantially parallel to the main board 10. The second outlet 20d is defined at an intermediate portion of the vertical plate 224 and opens toward the first outlet 20c. The inlet 20b covers the second outlet 20d and the first outlet 20c on a projection plane thereof.

The shielding assembly 27 is configured for regulating a size of the second outlet 20d. The shielding assembly 27 is positioned on the vertical plate 224 adjacent to the second outlet 20d. The shielding assembly 27 includes a rail 272, a blocking plate 274, and two protrusions 276. The blocking plate 274 extends through the rail 272. The blocking plate 274 is configured for sliding in the rail 272 to cover or open the second outlet 20d. The protrusions 276 perpendicularly extend from opposite sides of the blocking plate 274. The protrusions 276 abut the rail 272 to limit travel of the blocking plate 274.

The first sidewall 24 and the second sidewall 26 extend downwardly from opposite sides of the top wall 22. The first guide plate 28 extends from the first horizontal plate 220 and the angled plate 222 away from the air passage 20a. The second guide plate 29 extends from the angled plate 222 away from the air passage 20a. The second outlet 20d and the shielding assembly 27 are positioned between the first guide plate 28 and the second guide plate 29. In this embodiment, the first guide plate 28 and the first sidewall 24 are coplanar, and the second guide plate 29 and the second sidewall 26 are coplanar.

In other embodiments, the first guide plate 28 and the first sidewall 24 may not coplanar, nor may the second guide plate 29 and the second sidewall 26. The second outlet 20d and the shielding assembly 27 are arranged at the angled plate 222.

The first heat source 30 and the heat sink 40 are received in the air passage 20a. The heat sink 40 is connected to the first heat source 30 to dissipate heat generated by the first heat source 30. In this embodiment, the first heat source 30 may be a CPU or a display card.

The socket 50, mounted on the main board 10, faces the first outlet 20c and is spaced from the first outlet 20c. The socket 50 defines a number of slots 52 on a surface perpendicular to the main board 10. The second heat source 60 is received in a slot 52 parallel to the main board 10. The second heat source 60 is above the first horizontal plate 220 and faces the second outlet 20d. In this embodiment, the second heat source 60 is an expansion card.

The two fans 70 are adjacent to the inlet 20b for blowing air toward the first outlet 20c and the second outlet 20d through the inlet 20b.

In assembly, the first heat source 30 is connected to the heat sink 40. The first heat source 30 and the heat sink 40 are mounted on the main board 10. The air guiding device 20 covers the first heat source 30 and the heat sink 40. The first outlet 20c faces the socket 50.

The two fans 70 are mounted to the inlet 20b toward the first outlet 20c. The second heat source 60 is received in the slot 52 to face the second outlet 20d.

When the heat dissipation system 100 is in operation, one of the protrusions 276 is pulled to make the blocking plate 274 slide in the rail 272 to open the second outlet 20d. Airflow from the fans 70 through the first heat source 30 and the heat sink 40 toward the first outlet 20c evacuates heat from the first heat source 30. Airflow from the fans 70 through the second outlet 20d toward the second heat source 60 efficiently evacuates heat from the second heat source 60.

When the second heat source 60 is pulled out from the socket 50, one of the protrusions 276 is pulled to make the blocking plate 274 slide in the rail 272 to cover the second outlet 20d. Airflow from the fans 70 through the first heat source 30 and the heat sink 40 toward the first outlet 20c efficiently evacuates heat generated by the first heat source 30.

It is to be understood, however, that even though numerous characteristics and advantages of the present embodiments have been set fourth in the foregoing description, together with details of the structures and functions of the embodiments, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. An air guiding device mounting on a main board, thus the air guiding device and the main board cooperatively forming an air passage therebetween for allowing cooling air to pass therethrough, the air passage including an inlet at a first end of the air guiding device, a first outlet at an opposite second end of the air guiding device, and a second outlet, the air guiding device comprising:
   a top wall including the second outlet therein at an intermediate portion thereof, the second outlet opening toward the second end;
   two sidewalls extending downwardly from opposite sides of the top wall; and
   a shielding assembly positioned on the top wall for regulating a size of the second outlet.

2. The air guiding device as claimed in claim 1, wherein the top wall comprises a first horizontal plate at the second end, an angled plate proximate to the first horizontal plate, a second horizontal plate at the first end, and a vertical plate connected between the angled plate and the second horizontal plate.

3. The air guiding device as claimed in claim 2, wherein the shielding assembly comprises a rail and a blocking plate, the blocking plate is configured for sliding in the rail to cover or open the second outlet.

4. The air guiding device as claimed in claim 2, wherein the second outlet and the shielding assembly are arranged at the vertical plate.

5. The air guiding device as claimed in claim 2, wherein the second outlet and the shielding assembly are arranged at the angled plate.

6. The air guiding device as claimed in claim 1, further comprising a first guide plate and a second guide plate, the first guide plate extends from the first horizontal plate and the angled plate away from the air passage, the second guide plate extends from the angled plate away from the air passage, the second outlet and the shielding assembly are positioned between the first guide plate and the second guide plate.

7. The air guiding device as claimed in claim 1, wherein the first guide plate and the first sidewall are coplanar, the second guide plate and the second sidewall are coplanar.

8. A heat dissipation system comprising:
   a main board;
   an air guiding device mounted on the main board, the main board and the air guiding device cooperatively defining an air passage therebetween, the air passage including an inlet at a first end of the air guiding device, a first outlet at an opposite second end of the air guiding device, and a second outlet, the air guiding device comprising:
      a top wall;
      two sidewalls extending downwardly from opposite sides of the top wall; and
      a shielding assembly positioned on the top wall for regulating a size of the second outlet;
   a plurality of fans mounted on the main board for blowing air toward the inlet;
   a first heat source received in the air passage; and
   a second heat source arranged above the top wall and aligned with the second outlet.

9. The heat dissipation system as claimed in claim 8, further comprising a heat sink, wherein the heat sink is received in the air passage and is connected to the first heat source.

10. The heat dissipation system as claimed in claim 8, further comprising a socket mounted on the main board, and the second heat source is mounted in the socket.

* * * * *